(12) United States Patent
Tuomola

(10) Patent No.: US 9,392,729 B2
(45) Date of Patent: Jul. 12, 2016

(54) COOLING APPARATUS

(71) Applicant: ABB Oy, Helsinki (FI)

(72) Inventor: Juha Tuomola, Vantaa (FI)

(73) Assignee: ABB OY, Helsinki (FI)

( * ) Notice: Subject to any disclaimer, the term of this patent is extended or adjusted under 35 U.S.C. 154(b) by 133 days.

(21) Appl. No.: 14/255,212

(22) Filed: Apr. 17, 2014

(65) Prior Publication Data

US 2014/0313672 A1 Oct. 23, 2014

(30) Foreign Application Priority Data

Apr. 18, 2013 (EP) .................................... 13164229

(51) Int. Cl.
| | | |
|---|---|---|
| *F28F 1/02* | (2006.01) | |
| *H05K 7/20* | (2006.01) | |
| *H01L 23/473* | (2006.01) | |
| *F28D 15/02* | (2006.01) | |
| *F28D 15/04* | (2006.01) | |
| *F28F 1/32* | (2006.01) | |

(52) U.S. Cl.
CPC ........ *H05K 7/20336* (2013.01); *F28D 15/0233* (2013.01); *F28D 15/0266* (2013.01); *F28D 15/0275* (2013.01); *F28D 15/046* (2013.01); *F28F 1/022* (2013.01); *F28F 1/32* (2013.01); *H01L 23/473* (2013.01); *H05K 7/20263* (2013.01); *H05K 7/20936* (2013.01); *H01L 2924/0002* (2013.01)

(58) Field of Classification Search
CPC ............ H05K 7/20336; F28D 15/0233; F28D 15/0266
USPC .......................................................... 361/700
See application file for complete search history.

(56) References Cited

U.S. PATENT DOCUMENTS

| | | | | | |
|---|---|---|---|---|---|
| 6,005,772 | A | * | 12/1999 | Terao | ................... F28D 15/0233 165/104.21 |
| 2002/0135980 | A1 | * | 9/2002 | Vafai | ................... F28D 15/0233 361/700 |

(Continued)

FOREIGN PATENT DOCUMENTS

| | | |
|---|---|---|
| EP | 2 031 332 A1 | 3/2009 |
| EP | 2 260 957 A1 | 12/2010 |
| EP | 2 299 489 A2 | 3/2011 |

OTHER PUBLICATIONS

European Search Report mailed on Oct. 2, 2013, for European Application No. 13164229.

*Primary Examiner* — David M Sinclair
*Assistant Examiner* — Robert Brown
(74) *Attorney, Agent, or Firm* — Buchanan Ingersoll & Rooney PC

(57) ABSTRACT

Exemplary embodiments of the present disclosure are directed to an apparatus including pipes having internal longitudinal walls dividing the pipes into channels, a first and a second connecting part for providing a flow path between the channels of the pipes, a first heat transfer element having a first base plate with a first surface for receiving a heat load from one or more electric components and for transferring the heat load to a fluid, and a second heat transfer element. In order to obtain an efficient apparatus at least one first pipe that is at a location of an electric component is at least partly embedded in the first base plate via a second surface of the first base plate, while the pipes which are not at the location of an electric component are not embedded in the first base plate.

16 Claims, 3 Drawing Sheets

(56) References Cited

U.S. PATENT DOCUMENTS

| | | | |
|---|---|---|---|
| 2004/0228093 A1* | 11/2004 | Lee | G06F 1/181 361/701 |
| 2007/0130769 A1* | 6/2007 | Moon | B21C 23/085 29/890.032 |
| 2009/0056916 A1 | 3/2009 | Yesin et al. | |
| 2010/0270010 A1* | 10/2010 | Agostini | F28D 15/0233 165/104.27 |
| 2010/0277871 A1* | 11/2010 | Kitanaka | B60L 9/16 361/710 |
| 2010/0320753 A1 | 12/2010 | Uneno | |
| 2011/0061834 A1 | 3/2011 | Vaatainen et al. | |
| 2011/0127011 A1* | 6/2011 | Agostini | F28D 15/0266 165/104.21 |
| 2011/0206965 A1* | 8/2011 | Han | F28D 15/0233 429/120 |
| 2012/0097369 A1* | 4/2012 | Agostini | F28D 1/05391 165/104.21 |
| 2013/0146255 A1* | 6/2013 | Kim | F28D 1/0308 165/104.13 |
| 2013/0258594 A1* | 10/2013 | Gradinger | F28D 15/02 361/700 |
| 2013/0279115 A1* | 10/2013 | Blumenthal | G02B 6/4271 361/700 |
| 2013/0342994 A1* | 12/2013 | Li | H01L 23/4006 361/692 |
| 2014/0060780 A1* | 3/2014 | Moon | H05K 7/20336 165/104.21 |

\* cited by examiner

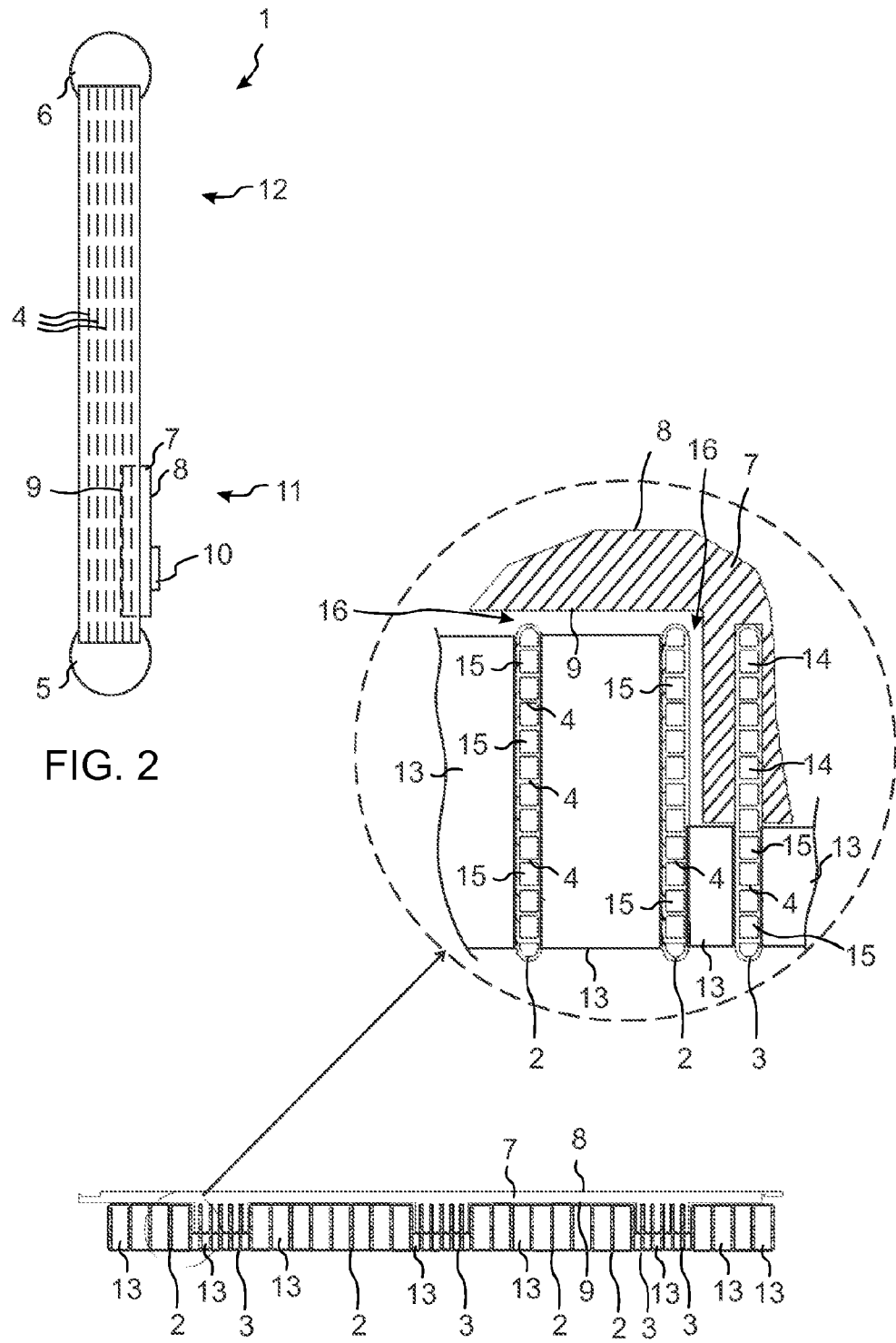

COOLING APPARATUS

RELATED APPLICATION

This application claims priority under 35 U.S.C. §119 to European Patent Application No. 13164229.0 filed in Europe on Apr. 18, 2013, the content of which is hereby incorporated by reference in its entirety.

FIELD

This disclosure relates to an apparatus having a first heat transfer element and a second heat transfer element for receiving a heat load from an electric component and for passing the heat load to the surrounding.

BACKGROUND INFORMATION

A known cooling element has a first heat transfer element with a base plate for receiving a heat load from an electric component. Pipes having internal longitudinal walls dividing the pipes into fluid channels can be at least partly embedded into the base plate to provide evaporator channels in the embedded parts of the pipes, which receive the heat load from the base plate and transfer it into a fluid in the evaporator channels.

The heated fluid is passed to a second heat transfer element having condenser channels used for cooling the fluid and for returning the cooled fluid to the evaporator channels. The condenser channels consist of those channels in the pipes which are not embedded in the base plate of the first heat transfer element.

Given this arrangement, the heat is usually not evenly distributed to the base plate from the one or more electric components. Therefore, those evaporator channels that can be located closest to the electric component work provide the best cooling results. The evaporator channels of the other pipes that can be embedded into the base plate cannot efficiently provide cooling for the electric component and the base plate.

In order to avoid a rise temperature, the base plate should be relatively thick and thereby have large mass. A thick and massive base plate ensures that the heat is more evenly distributed among the evaporator channels than in the case of a thin base plate. Disadvantages associated with a thick and massive base plate include, for example, an increase in the weight and price of the base plate. Additionally, manufacturing of a cooling element with a massive base plate is cumbersome.

SUMMARY

An apparatus is disclosed comprising: pipes having internal longitudinal walls dividing the pipes into channels; a first connecting part attached to first ends of the pipes for providing a flow path between the channels of the pipes; a second connecting part attached to second ends of the pipes for providing a flow path between the channels of the pipes; a first heat transfer element including a base plate with a first surface for receiving a heat load from one or more electric components and for transferring the heat load to a fluid; and a second heat transfer element for receiving the fluid from the first heat transfer element, and for transferring the heat load from the fluid, wherein at least one of first pipe is at a location of an electric component and is at least partly embedded in the base plate via a second surface of the base plate, and at least one second pipe is not at the location of an electric component and is not embedded in the base plate, wherein the channels of the at least one first pipe are evaporator channels that receive said heat load from the one or more electric components and pass the fluid to the second heat transfer element, and other channels of the at least one second pipe are condenser channels.

An exemplary cooling apparatus is disclosed comprising: a plurality of pipes, each pipe having an internal longitudinal wall that divides a respective pipe into channels; a first connecting part attached to first ends of the pipes for providing a flow path between the channels of the pipes; a second connecting part attached to second ends of the pipes for providing a flow path between the channels of the pipes; a first heat transfer element including a base plate with a first surface for receiving heat from at least one electric component and for transferring the heat to a fluid; and a second heat transfer element for receiving the heated fluid from the first heat transfer element, and for transferring the heat load from the fluid to external surroundings, wherein at least one first pipe is at a first location on the base plate and is at least partly embedded in a second surface of the base plate, and at least one second pipe is at a second location of the base plate and is on a surface of the base plate, wherein the channels of the at least one first pipe are evaporator channels that receive heat from the at least one electric component and pass the heated fluid to the second heat transfer element, and the channels of the at least one second pipe are condenser channels.

BRIEF DESCRIPTION OF THE DRAWINGS

In the following the present disclosure will be described in closer detail by way of example and with reference to the attached drawings, in which FIGS. 1 to 3 illustrate a first heat transfer apparatus according to an exemplary embodiment of the present disclosure.

DETAILED DESCRIPTION

Exemplary embodiments of the present disclosure are directed to a heat transfer apparatus with improved properties and which is less difficult to manufacture.

The apparatus can include pipes that are not at the location of an electric component that is not embedded in the base plate makes it possible to improve the efficiency of the apparatus and to simplify the construction and manufacturing of the apparatus. According to an exemplary embodiment of the present disclosure, the channels of the pipes that are not located at a location of the one or more electronic components can be efficiently utilized as condenser channels.

In an exemplary embodiment of the present disclosure, the distance between neighboring pipes whose all channels can be condenser channels is larger than the distance between neighboring pipes which can be at least partly embedded in the base plate or the second base plate. In this way more evaporator channels can be located where they can be most beneficial, such as at the location of the one or more electric component, and cooling of the one or more electric component can be obtained.

Figure 1:
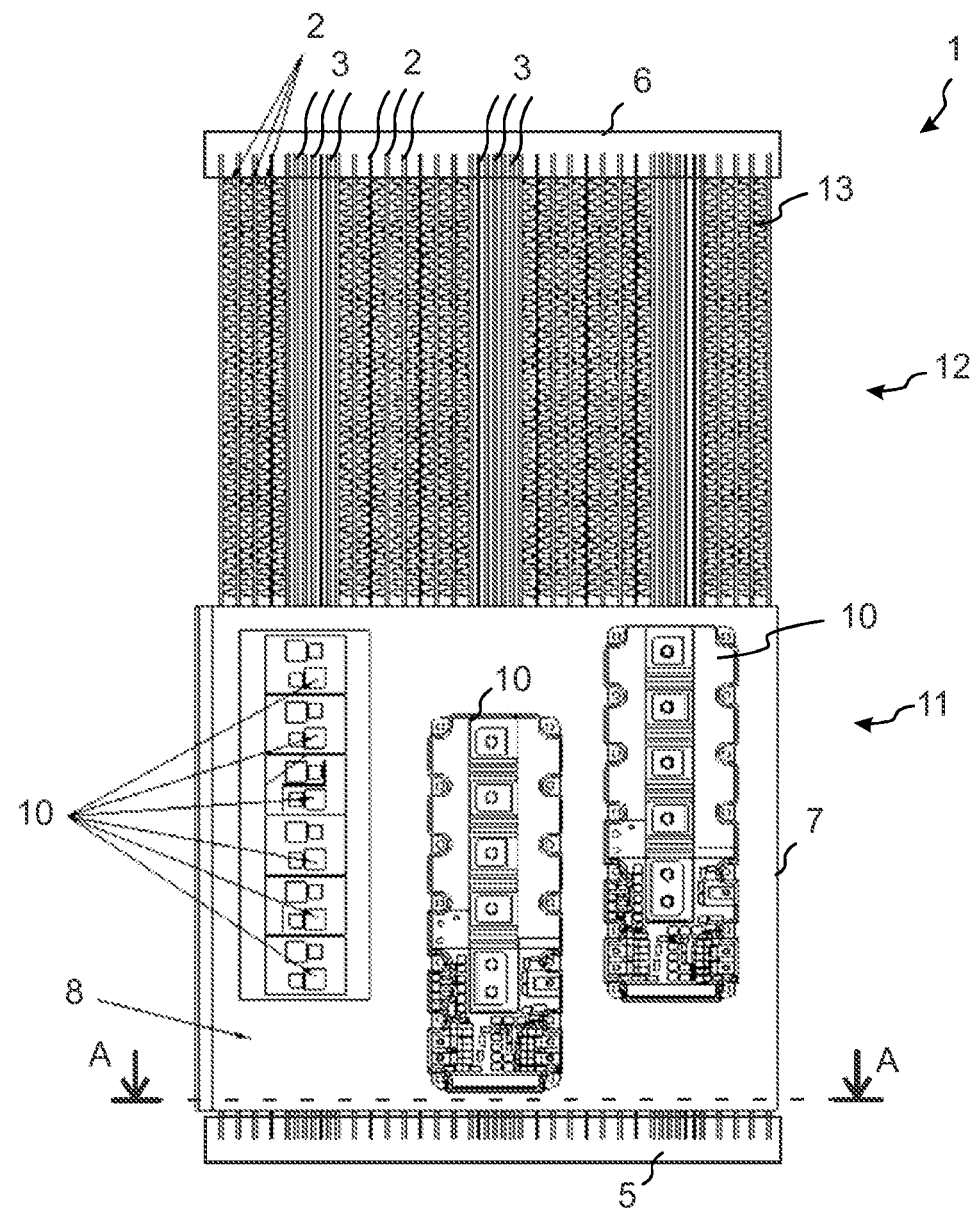

FIG. 1 illustrates a front view of a cooling apparatus 1 in accordance with an exemplary embodiment of the present disclosure. FIG. 2 illustrates a side view of the cooling apparatus 1 in accordance with an exemplary embodiment of the present disclosure; and FIG. 3 illustrates a cross section of a base plate and of the pipes along line A-A of the cooling apparatus 1 in accordance with an exemplary embodiment of the present disclosure. FIG. 3 additionally illustrates a partial enlargement illustrating the mutual location of the pipes and the base plate. For simplicity, the first connecting part 5 is not illustrated in FIG. 3.

The cooling apparatus 1 includes pipes 2 and 3 which have internal longitudinal walls 4 that divide the pipes 2 and 3 into channels. A first connecting part 5 is attached to first ends of the pipes 2 and 3 for providing a flow path between the channels of the pipes, and a second connecting part 6 is attached to second ends of the pipes 2 and 3 for providing a flow path between the channels of the pipes.

A first heat transfer element 11 includes a base plate 7 with a first surface 8 for receiving one or more electric components 10, and with a second opposite surface 9 for transferring a heat load from the electric components to a fluid in the channels of the pipes. The electric components can be high power components of a motor drive controlling feed of electricity to an electric motor, for example.

A second heat transfer element 12 receives the heated fluid from the first heat transfer element 12 via the pipes, and transfers heat from the fluid to the surroundings. In the illustrated embodiments, the second heat transfer element is by way of example assumed to include fins 13 extending between the pipes 2 and 3 in the second end of the apparatus such that heat is transferred via the fins 13 to the surrounding air. A fan can be utilized to improve the air flow via the fins 13 and transfer of heat from the fluid to the surroundings.

As shown in FIGS. 2 and 3, the pipes 3 which can be at the location of an electric component 10 can be at least partly embedded into the base plate 7 via the second surface 9 of the base plate. The pipes 2 are not at the location of an electric component 10 and are not embedded in the base plate. The channels of the embedded pipes 3 which can be located in the embedded part of the respective pipe can be evaporator channels 14 which receive the heat load from the one or more electric components and pass the heated fluid to the second heat transfer element 12. The other channels of the pipes 2 and 3 can be condenser channels 15.

From FIGS. 1 and 3 it can be seen that between the locations where one or more pipes 3 can be at least partly embedded into the base plate there is at least one or more pipes 2 which are not embedded into the base plate. All channels of these pipes 2 can be condenser channels 15. A gap 16 can separate these pipes 2 whose all channels can be condenser channels 15 from the base plate 7. Such a gap minimizes direct heat transfer from the base plate 7 to the condenser channels 15 where cooling of the fluid occurs.

As shown in FIGS. 1 to 3, fins 13 can be arranged along an entire length of the pipes, from the first connecting part 5 to the second connecting part 6 between the condenser channels. However, this feature is not specified for all embodiments. In an exemplary embodiment of the present disclosure, fins 13 can be arranged only in the upper part of the apparatus such that no fins can be present at the location of the base plate 7, for example.

The pipes 2 and 3 can be MPE (MultiPort Extruded) pipes which have been manufactured by extruding aluminum, for example. As illustrated in FIGS. 1-3, the base plate 7 is provided with thicker portions only at the locations of the electric components 10. In this part of the base plate 7, grooves have been formed and the pipes 3 which partly can be embedded into the base plate can be arranged into these grooves. Such a solution makes it possible to obtain a base plate that is less massive, as these thicker parts can be provided in a few locations and the other parts (e.g., locations) of the base plate can be thinner. Once the pipes can be in place in the grooves, the pipes and the base plate can be arranged in a furnace, where a solder used for attaching the pipes to the base plate can be melted.

In FIGS. 1 and 2, the apparatus 1 is illustrated in an upright position utilizing temperature differences and gravity for circulating fluid in the pipes. Fluid heated in the first heat transfer element 7 proceeds due to evaporation, for example, via the evaporator channels 14 upwards to the second heat transfer element 12 and the second connecting part 6. Once the fluid cools down it returns via the condenser channels 15 downwards to the first connecting part 5 and further into the evaporator channels 14 for a new cycle.

In order to improve circulation of the fluid and to ensure that correct circulation occurs also when the apparatus is in another position than the illustrated upright position, some of the channels 14 or 15 of the pipes 2 and 3 can have capillary dimensions. In that case, if the channels returning fluid from the second connecting part 6 to the first connecting part 5 have capillary dimensions, a flow of fluid from the second connecting part 6 to the first connecting part 5 can take place also when the apparatus is in another position than the illustrated upright position. In this context "capillary dimensions" refers to channels that can be capillary sized, in which case they have a size small enough so that bubbles can grow uniquely in a longitudinal direction (in other words in the flow direction as opposed to the radial direction) and thereby create a pulsating effect by pushing the liquid. According to exemplary embodiments of the present disclosure, the channels can be capillary sized so that no additional capillary structures are called for on their internal walls. The diameter of a channel which is considered capillary depends on the fluid that is used (boiling) inside. The following formula, for example, can be used to evaluate a suitable diameter:

$$D = (\mathrm{sigma}/(g*(\mathrm{rhol} - \mathrm{rhov})))^{0.5},$$

where sigma is the surface tension, g the acceleration of gravity, rhov the vapor density, and rhol the liquid density. This formula gives values from 1 to 3 mm for R134a (Tetrafluoroethane), R145fa and R1234ze (Tetrafluoropropene), which can be fluids suitable for use in the apparatus illustrated in the Figures.

Figure 4:
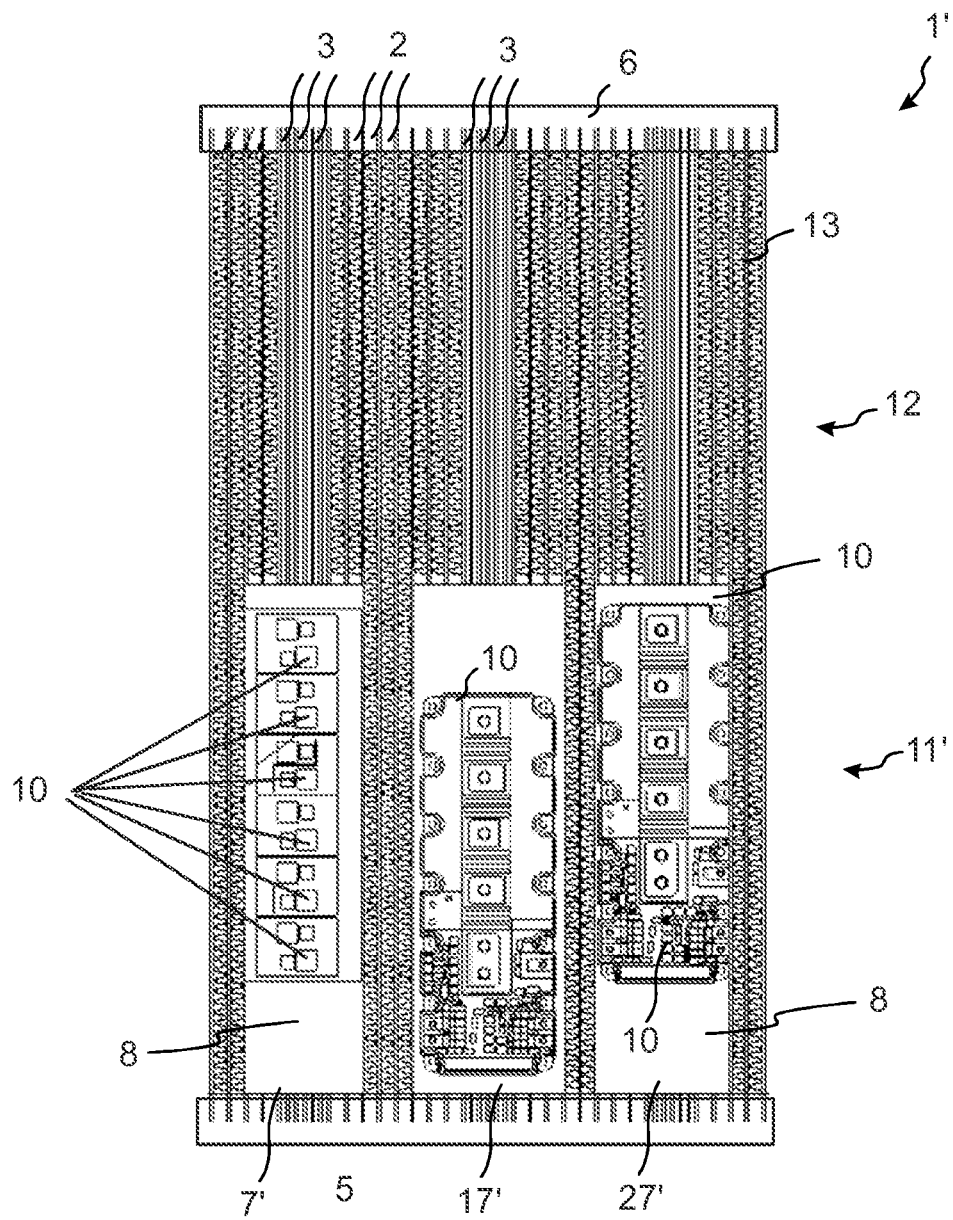
FIG. 4 illustrates a second heat transfer apparatus according to an exemplary embodiment of the present disclosure.

FIG. 4 illustrates a second heat transfer apparatus according to an exemplary embodiment of the present disclosure. The exemplary apparatus of FIG. 4 shares features explained in connection with exemplary embodiment of FIGS. 1 to 3, and therefore the embodiment of FIG. 4 will be explained mainly by pointing out the differences between these embodiments.

The pipes 2 and 3, the first and second connecting parts 5 and 6 and the second heat transfer element have been implemented in FIG. 4 similarly as has been explained in connection with FIGS. 1 to 3. However, instead of only one base plate, the apparatus includes a first 7', a second 17', and a third base plate 27'. Each base plate 7', 17', and 27' has a first surface 8 for receiving a heat load from tone or more electric components 10.

Similarly as in the previous embodiment, the pipes 3 which can be at the location of an electric component 10 can be at least partly embedded into the first, second and third base plates 7', 17', 27' via a second surface of the base plates, and the pipes 2 that are not at the location of an electric component 10 and are not embedded in the first, second and third base plates 7', 17', 27'.

To utilize more than one base plate provides the advantage that the base plates can be manufactured more precisely according to specifications of one or more electronic components. It is not specified to have only a single large and massive base plate for all electric components, but instead each component can have a base plate dimensioned according to respective specifications. However, naturally one or more of the base plates can contain more than one electric component. Also in such a case the result is in any case that the total weight and mass of the base plates can be minimized according to specifications of the one or more electronic components.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An apparatus comprising:
   pipes having internal longitudinal walls dividing the pipes into channels;
   a first connecting part attached to first ends of the pipes for providing a flow path between the channels of the pipes;
   a second connecting part attached to second ends of the pipes for providing a flow path between the channels of the pipes;
   a first heat transfer element including a base plate with a first surface for receiving a heat load from one or more electric components and for transferring the heat load to a fluid; and
   a second heat transfer element for receiving the fluid from the first heat transfer element, and for transferring the heat load from the fluid,
   wherein at least one of first pipe is at a location of an electric component and is at least partly embedded in the base plate via a second surface of the base plate, and at least one second pipe is not at the location of an electric component and is not embedded in the base plate,
   wherein the channels of the at least one first pipe are evaporator channels that receive said heat load from the one or more electric components and pass the fluid to the second heat transfer element, and other channels of the at least one second pipe are condenser channels,
   wherein the base plate of the first heat transfer element is a first plate, and wherein the first heat transfer element includes a second base plate with a first surface for receiving a heat load from one or more electric components,
   wherein the at least one first pipe which is at the location of an electric component is at least partly embedded in the second base plate via a second surface of the second base plate, while the at least one second pipe that is not at the location of an electric component is not embedded in the second base plate, and
   wherein the channels of the at least one first pipe are evaporator channels which receive said heat load from the one or more electric components and pass the heated fluid to the second heat transfer element, and the channels of the at least one second pipe are condenser channels.

2. The apparatus according to claim 1, wherein between the locations where the at least one first pipe is at least partly embedded in the first base plate or in the second base plate, there is at least one second pipe that is not embedded in the first base plate or in the second base plate, and whose channels are condenser channels.

3. The apparatus according to claim 1, wherein there is a gap separating the first base plate or the second base plate from the at least one second pipe that is not embedded in the first base plate or in the second base plate.

4. The apparatus according to claim 1, wherein the second heat transfer element comprises fins extending between walls of said condenser channels in order to transfer heat from said fluid in said condenser channels to surroundings via said fins.

5. The apparatus according to claim 1, wherein a distance between neighboring second pipes which are not embedded in the first base plate or the second base plate is larger than a distance between neighboring first pipe which are at least partly embedded in the base plate or the second base plate.

6. The apparatus according to claim 1, wherein at least some of the channels of the pipes have capillary dimensions.

7. A cooling apparatus comprising:
   a plurality of pipes, each pipe having an internal longitudinal wall that divides a respective pipe into channels;
   a first connecting part attached to first ends of the pipes for providing a flow path between the channels of the pipes;
   a second connecting part attached to second ends of the pipes for providing a flow path between the channels of the pipes;
   a first heat transfer element including a base plate with a first surface for receiving heat from at least one electric component and for transferring the heat to a fluid; and
   a second heat transfer element for receiving the heated fluid from the first heat transfer element, and for transferring the heat load from the fluid to external surroundings,
   wherein at least one first pipe is at a first location on the base plate and is at least partly embedded in a second surface of the base plate, and at least one second pipe is at a second location of the base plate and is on a surface of the base plate,
   wherein the channels of the at least one first pipe are evaporator channels that receive heat from the at least one electric component and pass the heated fluid to the second heat transfer element, and the channels of the at least one second pipe are condenser channels.

8. The cooling apparatus of claim 7, wherein the first location on the base plate is at an electric component.

9. The cooling apparatus of claim 7, wherein the second location on the base plate is away from an electric component.

10. The apparatus according to claim 7, wherein between the locations where the at least one first pipe is at least partly embedded in the base plate there is at least one second pipe that is not embedded in the base plate and whose channels are condenser channels.

11. The apparatus according to claim 7, wherein there is a gap separating the first base plate from the at least one second pipe that is not embedded in the base plate.

12. The apparatus according to claim 7, wherein the second heat transfer element comprises fins extending between walls of said condenser channels in order to transfer heat from said heated fluid in said condenser channels to the external surroundings via said fins.

13. The apparatus according to claim 7, wherein a distance between neighboring second pipes which are not embedded in the first base plate is larger than a distance between neighboring first pipe which are at least partly embedded in the base plate.

14. The apparatus according to claim 7, wherein at least some of the channels of the pipes have capillary dimensions.

15. The apparatus according to claim 7, wherein the base plate of the first heat transfer element is a first plate, the first heat transfer element comprising:

at least one second base plate adjacent the first base plate, the at least one second base plate having a first surface for receiving a heat load from one or more electric components.

16. The apparatus according to claim 15, wherein the at least one first pipe which is at the location of an electric component is at least partly embedded in the second base plate via a second surface of the second base plate, while the at least one second pipe that is not at the location of an electric component is not embedded in the second base plate, and
the channels of the at least one first pipe are evaporator channels which receive said heat load from the one or more electric components and pass the heated fluid to the second heat transfer element, and the channels of the at least one second pipe are condenser channels.

* * * * *